United States Patent
Fischer et al.

(10) Patent No.: US 6,608,846 B1
(45) Date of Patent: Aug. 19, 2003

(54) BISTABLE LASER DEVICE WITH MULTIPLE COUPLED ACTIVE VERTICAL-CAVITY RESONATORS

(75) Inventors: Arthur J. Fischer, Albuquerque, NM (US); Kent D. Choquette, Urbana, IL (US); Weng W. Chow, Cedar Crest, NM (US)

(73) Assignee: Sandia Corporation, Albuquerque, NM (US)

( * ) Notice: Subject to any disclaimer, the term of this patent is extended or adjusted under 35 U.S.C. 154(b) by 126 days.

(21) Appl. No.: 09/846,874

(22) Filed: May 1, 2001

(51) Int. Cl.[7] ............... H01S 3/30; H01S 5/00; H01S 3/082
(52) U.S. Cl. ............... 372/8; 372/50; 372/97
(58) Field of Search .............. 372/50, 8, 81, 372/43, 44, 46, 97, 23

(56) References Cited

U.S. PATENT DOCUMENTS 6,026,108 A * 2/2000 Lim et al. .................. 372/50

FOREIGN PATENT DOCUMENTS

| JP | 03-240285 A | * 10/1991 | .................. 372/81 |
| JP | 05-343807 A | * 6/1992 | .................. 372/44 |
| JP | 05-121830 A | * 5/1993 | .................. 372/43 |
| JP | 06-029625 A | * 2/1994 | .................. 372/43 |

* cited by examiner

*Primary Examiner*—Quyen Leung
(74) *Attorney, Agent, or Firm*—Brian W. Dodson; John P. Hohimer

(57) ABSTRACT

A new class of bistable coupled-resonator vertical-cavity semiconductor laser devices has been developed. These bistable laser devices can be switched, either electrically or optically, between lasing and non-lasing states. A switching signal with a power of a fraction of a milliwatt can change the laser output of such a device by a factor of a hundred, thereby enabling a range of optical switching and data encoding applications.

11 Claims, 1 Drawing Sheet

BISTABLE LASER DEVICE WITH MULTIPLE COUPLED ACTIVE VERTICAL-CAVITY RESONATORS

GOVERNMENT RIGHTS

Figure 1:
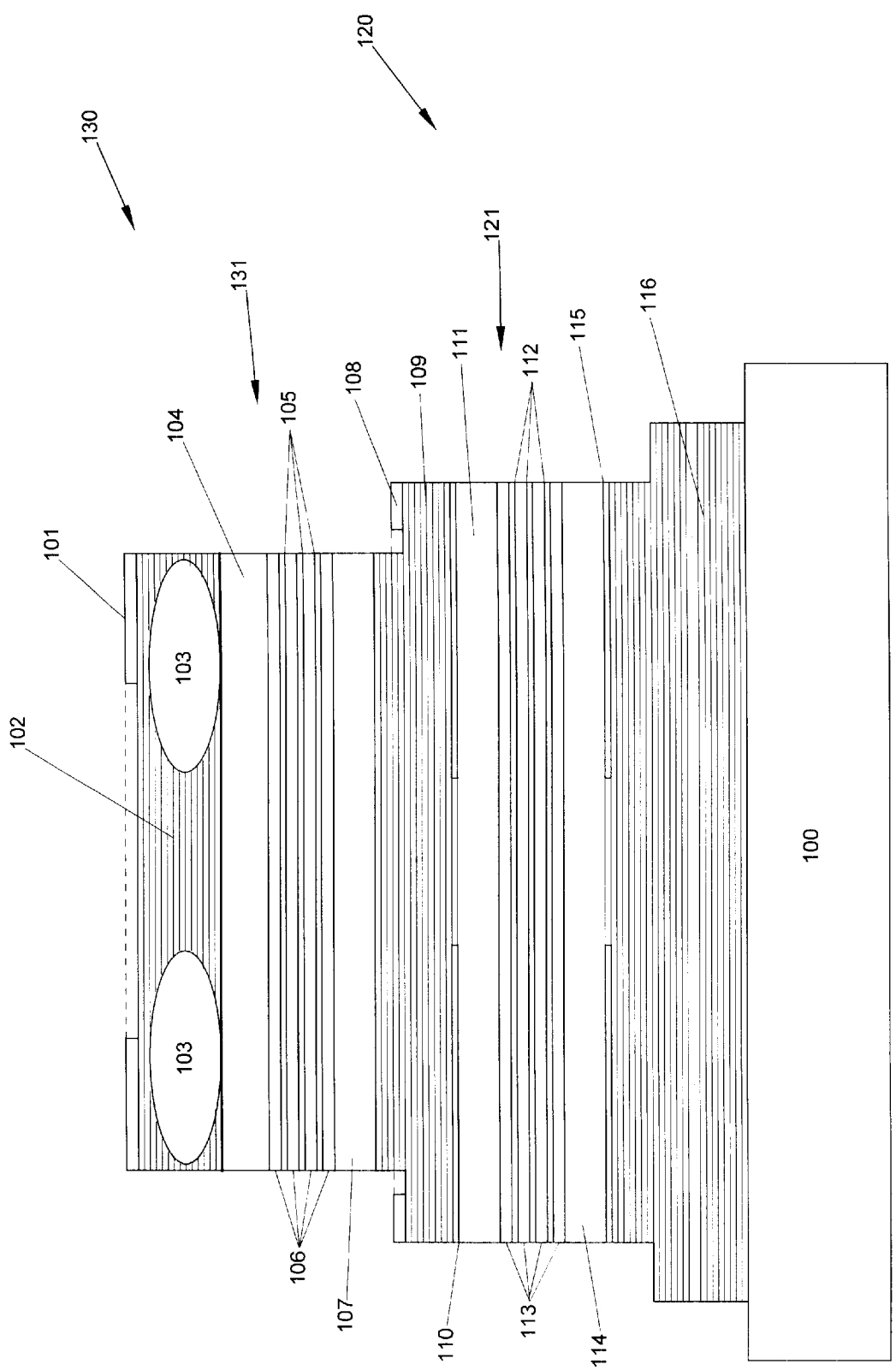

This invention was made with Government support under Contract DE-AC04-94AL85000 awarded by the U.S. Department of Energy. The Government has certain rights in the invention.

FIELD OF THE INVENTION

The present invention relates generally to active optoelectronic devices, and more specifically to such devices based upon bistable vertical-cavity lasers.

BACKGROUND OF THE INVENTION

A bistable optical device is one which exhibits some optical property (e.g., transmissivity, reflectivity, polarization activity, emission intensity, emission polarization, etc.) which, for a range of input parameters, takes on one of two distinct parameters. Such a device is said to be in one state or the other, depending on the value of the bistable optical property. A state need not represent a unique value of the parameters describing the bistable optical property, but rather can describe a typical range. Hence, a device which exhibits transmissivity of 90–95%, or of 5–15%, would have two distinct states.

Bistable devices often show some degree of hysteresis in their switching behavior. That is, the state of such a device does not always depend on the current inputs and conditions, but can also be history-dependent. An example from electronic bistable devices would be a digital switch, such as a digital flip-flop.

A flip flop initially in the low state remains in the low state until a sufficiently large control voltage $V_+$ is input, whereupon the flip flop switches to the high state. Conversely, a flip flop initially in the high state remains in the high state until a sufficiently low control voltage $V_-$ is input, whereupon the flip flop switches to the low state.

Typically, however, $V_+$ is larger than $V_-$, so that there is an intermediate range of control voltages for which the device state depends on the history. If the device was in the low state before applying an intermediate control voltage, it remains in the low state, whereas if the device was in the high state before applying an intermediate control voltage, it remains in the high state. The state of the device is thus history-dependent for some range of the control voltage.

Hysteresis can complicate a number of applications, but contributes greatly to the use of bistable devices as switches. Without hysteresis (e.g., when $V_+=V_-$), the state of a bistable switch near the switching threshold depends sensitively upon the exact value of the input, and such a switch is therefore very sensitive to noise and imperfect inputs.

However, a bistable device without hysteresis can enable another set of applications. Obvious possibilities include pulse shapers, limiters, and thresholding elements.

Additionally, in most real devices, the switch from one state to another in a bistable device without hysteresis is not infinitely sharp. As a result, there can be a region of input parameters within which a small change of those parameters results in a large change in the bistable output property. Such a device can produce large differential gain (or other response), and hence act as an amplifier. Bistable optical devices have a plethora of potential applications, the best known of which lie in the regions of optical switching, optical data transmission, and optical computing. Most current bistable optical devices depend on the interaction of two characteristics, nonlinearity and feedback.

In purely optical bistable devices, the nonlinearity is typically dispersive or dissipative, and results from the use of optical materials which have intrinsically nonlinear optical response. Feedback is provided in any of a number of ways common to laser applications.

In hybrid bistable optical devices, the nonlinearity is typically provided by applying an external field to a non-linear optical material. This results in a macroscopic change in refractive index, polarization shift, or some other suitable parameter, which change then alters the state of the device. Feedback is provided electrically, e.g., by monitoring the optical output of the device, and in response changing the intensity of the external field. Such devices have the advantage that they can be used effectively with optical throughput of much smaller intensity than is typically required of intrinsic bistable optical devices, in which the throughput must have sufficient intensity to drive the optical nonlinearity.

Lasers commonly exhibit some degree of optical bistability regarding their lasing threshold. In semiconductor lasers, for example, a larger excitation current is required to initiate lasing than is required to maintain lasing. In principle this bistability is useful for applications involving optical signal processing, high density optical memory, and optical interconnections, as well as hybrid optoelectronic computation.

Bistable vertical-cavity lasers are of special interest for such applications, because of the high 1-D and 2-D device densities which can be achieved using straightforward integration techniques. However, the size of the hysteretic region in conventional vertical-cavity surface-emitting lasers (VCSELs) is quite small, thus limiting the use of such devices as bistable switching elements.

There is therefor a clear need for a new type of vertical-cavity laser device which exhibits a large and stable hysteretic region.

Conventional vertical-cavity surface emitting lasers (VCSELs) generally comprise a slab of active laser gain medium sandwiched between a pair of dielectric mirrors, these substructures being monolithically integrated on the surface of a semiconductor substrate. Such devices are usually lattice-matched or strained-layer structures, made of single-crystal direct-gap semiconductor materials. The most common materials used for construction are gallium arsenide based semiconductor alloys. VCSELs are commonly used to optically transfer information from one subsystem to another, either via free-space coupling or by coupling to a fiber optic.

SUMMARY OF THE INVENTION

A class of bistable semiconductor vertical-cavity laser devices has been invented. These devices comprise multiple vertically coupled resonators, each such resonator containing regions of electrically-pumped laser gain media. Each region of laser gain media can be independently injected with current, resulting in an operating parameter space with distinct regions of optical behavior. These devices exhibit large regions of hysteretic behavior, thereby enabling their use in optical switching and data encoding applications.

BRIEF DESCRIPTION OF THE ILLUSTRATIONS

FIG. 1 shows a schematic cross-section of an implementation of the instant invention.

DETAILED DESCRIPTION

The instant invention is a class of semiconductor laser devices which exhibit optical bistability with large regions of hysteretic response. Such devices are based upon VCSELs, but have multiple resonant cavities with independently excitable laser gain media. A device according to the instant invention has three or more electrical terminals, and functions in a much more complex manner than does the simple VCSEL.

Briefly, the instant invention is of a bistable coupled-resonator vertical-cavity laser (CRVCL) which has multiple optically coupled cavities at least two of which contain active laser gain media. These active gain media can be independently excited, and variations of the excitation currents are associated with a number of operational functionalities.

The structure of a particular implementation of a bistable optical coupled-resonator vertical-cavity laser device with a large hysteretic region according to the instant invention is shown in FIG. 1. The drawing is not to scale. This implementation is described as being fabricated using the GaAs/AlGaAs compound semiconductor system, but the instant invention can be implemented in a variety of semiconductor systems. Efficient operation of such devices is aided if the semiconductor materials are single crystals. The lattice mismatch between the various materials used will usually be chosen to be sufficiently small that undue degradation of device operation from the presence or formation of dislocations and other defects does not occur.

An implementation of a bistable CRVCL according to the instant invention is fabricated on top of a GaAs substrate 100 which is doped to form a base electrical terminal which forms an electrical contacts to a base distributed Bragg reflector (DBR) 116, which is located atop substrate 100.

Base DBR 116 comprises alternating layers of at least two different semiconductor materials. The alternating layers, in this example being GaAs and AlGaAs, have optical thicknesses chosen so that base DBR 116 has optical reflectivity and transmissivity suitable for the desired operation of the device.

Additionally, in the example shown in FIG. 1, the alternating layers are doped to be electrically conducting so that an electrical input to base DBR 116 pass through to the remainder of the device. This function can also be served by vias to the substrate and other similar structures.

Laser cavity structure 120 is located on top of base DBR 116. Laser cavity structure 120 comprises laser cavity DBR 109 and active laser medium stratum 121, which is sandwiched between base DBR 116 and laser cavity DBR 109. In this example, laser cavity DBR 109 is electrically conducting, and is functionally attached to laser cavity electrical terminal 108.

In this example, active laser medium stratum 121 comprises multiple GaAs quantum wells 112 which are sandwiched between AlGaAs barrier layers 113. Active laser medium stratum 121 further comprises electrically conducting spacing layers 111 and 114, which cap the sandwich of barrier layers 113 and quantum wells 112.

In the example of FIG. 1, laser cavity structure 120 further comprises current concentration structure 110 and current concentration structure 115. Both these current concentration structures comprise an insulating layer with an aperture, the aperture positioned where the highest current concentration, and hence the maximum laser activity, is desired. The insulating layer can consist essentially of an oxidized semiconductor layer.

A second laser cavity structure 130 is located atop the first laser cavity structure 120. Laser cavity structure 130 comprises laser cavity DBR 102 and active laser medium stratum 131, which is sandwiched between laser cavity DBR 109 and laser cavity DBR 102.

In this example, laser cavity DBR 102 is electrically conducting, and is functionally attached to laser cavity electrical terminal 101. Laser cavity DBR 102 also comprises current concentration structure 103. Current concentration structure 103 comprises an annular region within laser cavity DBR 102, where the material in the annular region has been damaged by ion implantation so as to reduce the electrical conductivity of the annular region. Current passing from laser cavity electrical terminal 101 through laser cavity DBR 102 to the remainder of the device is thereby forced to primarily pass through the aperture within current concentration structure 103.

In this example, active laser medium stratum 131 comprises multiple GaAs quantum wells 105 which are sandwiched between AlGaAs barrier layers 106. Active laser medium stratum 131 further comprises electrically conducting spacing layers 104 and 107, which cap the sandwich of barrier layers 106 and quantum wells 105.

The thicknesses of laser cavity structures 120 and 130 are adjusted so that they are an integral number of their respective operating wavelengths in optical thickness. Note that the operating wavelength of laser cavity structures 120 and 130 need not be the same.

The coupling of the two laser cavity structures through laser cavity DBR 109 shifts the resonant modes of the device from those of the isolated laser cavity structures alone. When the isolated resonant modes have the same wavelength, the coupling between the cavities produces a splitting of the modes.

The resonant modes are split in wavelength by their coupling by an amount ranging from vanishingly small in the case where laser cavity DBR 109 is very thick (hence producing very little coupling), to a wavelength splitting of several percent when laser cavity DBR 109 is only a few pairs of layers in thickness, leading to very strong coupling between the resonators.

The CRVCL structure in FIG. 1 is configured as a three-terminal electrically driven device. Any of the electrical terminals (101, 108, or 100) can act as a source or drain for the other electrical terminals. This allows independent control of the current density in either of the active laser medium strata 121 and 131.

Applicants fabricated a CRVCL structure similar to that shown in FIG. 1. The structure was grown on a p-doped GaAs substrate. The base DBR was a p-type AlGaAs/GaAs distributed Bragg reflector with 35 periods of quarter-wave thickness layers. An AlGaAs layer was grown on top of the base DBR, and was selectively oxidized in an annular pattern so that the portion of the layer in the annulus became greatly reduced in electrical conductivity.

A first active laser medium stratum was grown on the proceeding structure. A first layer of p-type GaAs was grown on top of the selectively oxidized AlGaAs layer. This was followed by 6 AlGaAs barrier layers with 5 GaAs quantum wells with a thickness of 8 nanometers interleaved between them, and a layer of n-type GaAs. The total optical thickness of the p-type GaAs layer, the barrier layers, the quantum wells, and the n-type GaAs layer was one wavelength at the resonant wavelength of the laser cavity structure.

On top of the structure described above was grown another AlGaAs layer which is selectively-oxidized in an annular pattern. On top of this was grown a n-type AlGaAs/ GaAs laser cavity DBR with 11.5 periods. This amount of coupling produces a resonant mode splitting of about 1.4%.

A second active laser medium stratum was then grown on top of the proceeding structure, consisting essentially of a first layer of n-type GaAs was grown on top of the selectively oxidized AlGaAs layer. This was followed by 6 AlGaAs barrier layers with 5 GaAs quantum wells with a thickness of 8 nanometers interleaved between them, and a layer of p-type GaAs. The total optical thickness of the n-type GaAs layer, the barrier layers, the quantum wells, and the p-type GaAs layer was one wavelength at the resonant wavelength of the laser cavity structure.

Finally, a p-type AlGaAs/GaAs laser cavity DBR with 22 periods was grown on top of the proceeding structure. An annular region of the 22-period laser cavity DBR was implanted with protons to produce current confinement. Following a two-tier etch, electrical terminals were formed on the topmost laser cavity DBR and on the middle laser cavity DBR. Electrical contact to the base DBR was made through the GaAs substrate.

The device described above exhibits optical bistability in switching between subthreshold lasing, with an output of tens of microwatts, and normal lasing, with an output of several milliwatts. The contrast ratio between the on and off states is on the order of 100:1. The hysteretic region of this device is very large, in some cases taking up the majority of the operating parameter space, and in particular can include the peak lasing output power.

In devices after the instant invention, the bistability appears to be the combined result of optical feedback, and bias-induced and optically-induced changes in optical absorption in the top laser gain medium stratum. Conventional thermal shut-off effects also appear, and add additional behavior to these devices which must be taken into account in applications.

The device is able to overcome the optical absorption in the top laser gain medium stratum when no bias is applied thereto, and hence will lase at an onset bottom cavity current. As a bias current is applied to the top cavity, the optical absorption of the top laser gain medium stratum increases, and the onset bottom cavity current increases in response. In the device described above, the onset bottom cavity current is about 16 milliamps for zero bias current, and increases to about 26 milliamps for a bias current of 5 milliamps.

Once this device is lasing, reduction of the bottom cavity current produces a smooth fall-off in laser output, with zero laser output occurring near 6–8 milliamps, depending on the value of the bias current.

The bistable cutoff actually occurs at larger values of bottom cavity current. This appears to be related to the smooth thermal shut-off commonly exhibited by VCSELs, in which the gain of the laser medium and the resonance of the optical cavity become progressively misaligned in wavelength as the exciting current, and hence the device temperature, is increased.

However, in the device described above, the cutoff in laser output is quite abrupt, requiring a change of only a small fraction of a milliampere in bottom cavity current to switch from full laser output to subthreshold lasing, associated with a 100-fold reduction in device output. It appears that the saturable absorption of the lasing medium in the upper coupled cavity combined with the thermal rollover effects in the lower cavity produces the very sharp lasing cutoff at large bottom cavity current.

Once the cutoff of the above device has been driven by application of large bottom cavity current, the device cannot again lase until the reduction in the bottom cavity current allows the gain and resonance wavelengths to realign, thereby allowing the laser medium gain to overcome the cavity losses. For suitable values of bias current, this reinitiation of lasing can occur for values of the bottom cavity current which are not greatly reduced from the device cutoff current. Alternately, the device can be switched by changing the bias current for a fixed bottom cavity current.

When the device described above is operated with a fixed bottom cavity current of 31.5 milliamps, reversible switching between on and off states can be produced by switching the bias current between 3.5 milliamps and 2.5 milliamps. With proper design, the effect of current concentration can reduce the change in bias current required to switch the device to about 0.1 milliamps, so that a 100-fold change in device output can be triggered with a signal of a few hundred microamps. As optical switches go, this is a very low-power and efficient device.

Switching between the on and off states can also be triggered by an external optical trigger. Such switching can occur due to device heating, reduction of absorption in the upper cavity due to saturation, direct injection of additional resonant photons into the device, or combinations of these effects, depending on the operating parameters of the device.

Description of the specific implementations above is not intended to limit the scope of the invention. The scope of the invention is intended to be set by the claims in view of the specification and the drawings.

What is claimed is:

1. A bistable laser device comprising:
   a) a base distributed Bragg reflector, comprising alternating layers of at least two electrically conducting single crystal semiconductor materials;
   b) a base electrical terminal functionally attached to the base distributed Bragg reflector; and,
   c) at least two laser cavity structures disposed in a vertical stack above the base distributed Bragg reflector, each of said laser cavity structures having a resonance wavelength and comprising;
      1) an active laser medium stratum;
      2) a laser cavity distributed Bragg reflector positioned above the active laser medium stratum, such that the laser cavity distributed Bragg reflector comprises alternating layers of at least two electrically conducting single crystal semiconductor materials; and,
      3) a laser cavity electrical terminal functionally attached to the laser cavity distributed Bragg reflector.

2. The bistable laser device of claim 1, wherein at least one active laser medium stratum comprises at least one active quantum well.

3. The bistable laser device of claim 1, wherein each of the active laser medium strata comprises at least one active quantum well.

4. The bistable laser device of claim 1, wherein at least one active laser medium stratum comprises multiple active quantum wells.

5. The bistable laser device of claim 4, wherein the band structure of at least one of the active laser medium strata is altered by carrier tunneling between the multiple quantum wells within said active laser medium strata.

6. The bistable laser device of claim 1, wherein each of the active laser medium strata comprises multiple active quantum wells.

7. The bistable laser device of claim 6, wherein the band structure of each active laser medium stratum is altered by carrier tunneling between the multiple quantum wells within said active laser medium stratum.

8. The bistable laser device of claim 1, further comprising current concentration structures.

9. The bistable laser device of claim 8, wherein one of the current concentration structures comprises a disordered region within the uppermost laser cavity distributed Bragg reflector.

10. The bistable laser device of claim 8, wherein at least one of the current concentration structures is integrated with a laser cavity structure so that said laser cavity structure further comprises an insulating layer with an aperture, said insulating layer being positioned between the active laser medium stratum and the laser cavity distributed Bragg reflector.

11. The bistable laser device of claim 8, wherein at least one of the current concentration structures is integrated with a laser cavity structure so that said laser cavity structure further comprises an insulating layer with an aperture, said insulating layer being positioned beneath the active laser medium stratum.

* * * * *